(12) United States Patent
Oh

(10) Patent No.: US 7,617,354 B2
(45) Date of Patent: Nov. 10, 2009

(54) ABBREVIATED BURST DATA TRANSFERS FOR SEMICONDUCTOR MEMORY

(75) Inventor: Jong-Hoon Oh, Chapel Hill, NC (US)

(73) Assignee: Qimonda North America Corp., Cary, NC (US)

( * ) Notice: Subject to any disclaimer, the term of this patent is extended or adjusted under 35 U.S.C. 154(b) by 427 days.

(21) Appl. No.: 11/683,629

(22) Filed: Mar. 8, 2007

(65) Prior Publication Data

US 2008/0219074 A1    Sep. 11, 2008

(51) Int. Cl.
*G06F 12/00* (2006.01)
(52) U.S. Cl. .................. 711/105; 711/167; 711/213
(58) Field of Classification Search ............... None
See application file for complete search history.

(56) References Cited

U.S. PATENT DOCUMENTS

| | | | | |
|---|---|---|---|---|
| 5,680,643 A | * | 10/1997 | Flynn ........................ 710/35 |
| 5,784,582 A | * | 7/1998 | Hughes ...................... 710/117 |
| 5,974,514 A | * | 10/1999 | Andrewartha et al. ........ 711/166 |
| 6,321,310 B1 | * | 11/2001 | McCarthy et al. ........... 711/154 |
| 6,336,154 B1 | * | 1/2002 | McCarthy et al. ............. 710/35 |
| 7,082,502 B2 | * | 7/2006 | Najam et al. ................ 711/147 |
| 7,428,618 B2 | * | 9/2008 | Najam et al. ................ 711/147 |
| 2002/0194291 A1 | * | 12/2002 | Najam et al. ................ 709/213 |
| 2003/0074517 A1 | * | 4/2003 | Nicolai ........................ 711/5 |
| 2006/0004912 A1 | * | 1/2006 | Najam et al. ................ 709/213 |

* cited by examiner

*Primary Examiner*—Kevin Verbrugge
(74) *Attorney, Agent, or Firm*—Coats & Bennett, P.L.L.C.

(57) ABSTRACT

An integrated circuit having a nominal minimum burst length defined by a nominal data prefetch size transfers data by accepting an abbreviated burst data read request directed to a first bank, prefetching less than the nominal data prefetch size, and providing the data in an abbreviated burst data transfer less than the nominal minimum burst length.

21 Claims, 4 Drawing Sheets

ABBREVIATED BURST DATA TRANSFERS FOR SEMICONDUCTOR MEMORY

BACKGROUND

Increases in integrated circuit technology have resulted in a dramatic increase in the clock speeds of digital circuits have increased dramatically. Comparable advances in speed have not been achieved in Dynamic Random Access Memory (DRAM) arrays, with the result that data cannot be stored to or retrieved from DRAM arrays as fast as the data can be transferred into or out of a Synchronous DRAM (SDRAM) component at its data bus (DQ). To achieve high read data transfer speeds, many SDRAM components prefetch more data from a DRAM array than can be transferred on DQ in one cycle, and deliver the data successively, in a burst read operation. Similarly, the SDRAM component queues data from a plurality of data transfers in a burst write operation (also referred to herein as prefetching), and stores the data to the DRAM array in one cycle. By prefetching from and/or to the DRAM array, and pipelining burst read and/or write operations for contiguous data, the SDRAM component can achieve a higher data transfer throughput at the DQ pins than the DRAM array could support with single datum fetches and/or stores.

SDRAM components that support burst read and write operations typically prefetch data in a nominal prefetch data size that is determined by their internal architecture. The nominal prefetch data size determines the minimum burst length. For example, an SDRAM component with a 4-bit prefetch size—that is, it prefetches four bits of data for each bit in its data bus—would have a minimum burst length of four. However, in some applications, a shorter burst length is desired.

To accommodate a burst length less than the nominal prefetch data size, some DRAM components allow a burst data transfer operation to one DRAM bank to be interrupted by a data transfer directed to another DRAM bank. In this case (assuming data read operations), the SDRAM component prefetches the nominal prefetch data size (e.g., 4-bits per DQ bit) from the first bank in response to the first burst read request, buffers the data, and directs it serially to the DQ bus. In response to a burst read request in, e.g., the next cycle directed to the second bank, the SDRAM component prefetches the nominal prefetch data size from the second bank, and directs the data serially to the DQ bus with, in effect, a higher priority than the data from the first bank. From the arrival, at the DQ pins, of the data from the first bank until the arrival of the data from the second bank, the SDRAM component successively provides data from the first bank. When data from the second bank arrives at the DQ pins, the SDRAM component discards the remaining data from the first bank, and begins to successively provide data from the second bank. The second burst may run to completion, or may itself be interrupted by a request directed to another bank.

Although the interrupted burst operation achieves a burst data transfer of less than the nominal prefetch data size, it does so at the cost of expending the power to retrieve data in the first prefetch operation that is later discarded. Additionally, the interrupted burst operation results in successive, or "back-to-back," DRAM array prefetch operations—each directed to a separate bank—which may exhibit some overlap. This increases the instantaneous power consumption of the SDRAM component. To compensate for the higher power demands, the power net in the integrated circuit is widened, adding to the die size overhead. The logic necessary to support the interrupted burst operation also consumes both integrated circuit real estate and power.

SUMMARY

In one or more embodiments disclosed and claimed herein, an integrated circuit having a nominal minimum burst length defined by a nominal data prefetch size transfers data by accepting an abbreviated burst data read request directed to a first bank, prefetching less than the nominal data prefetch size, and providing the data in an abbreviated burst data transfer less than the nominal minimum burst length.

DETAILED DESCRIPTION

Figure 1:
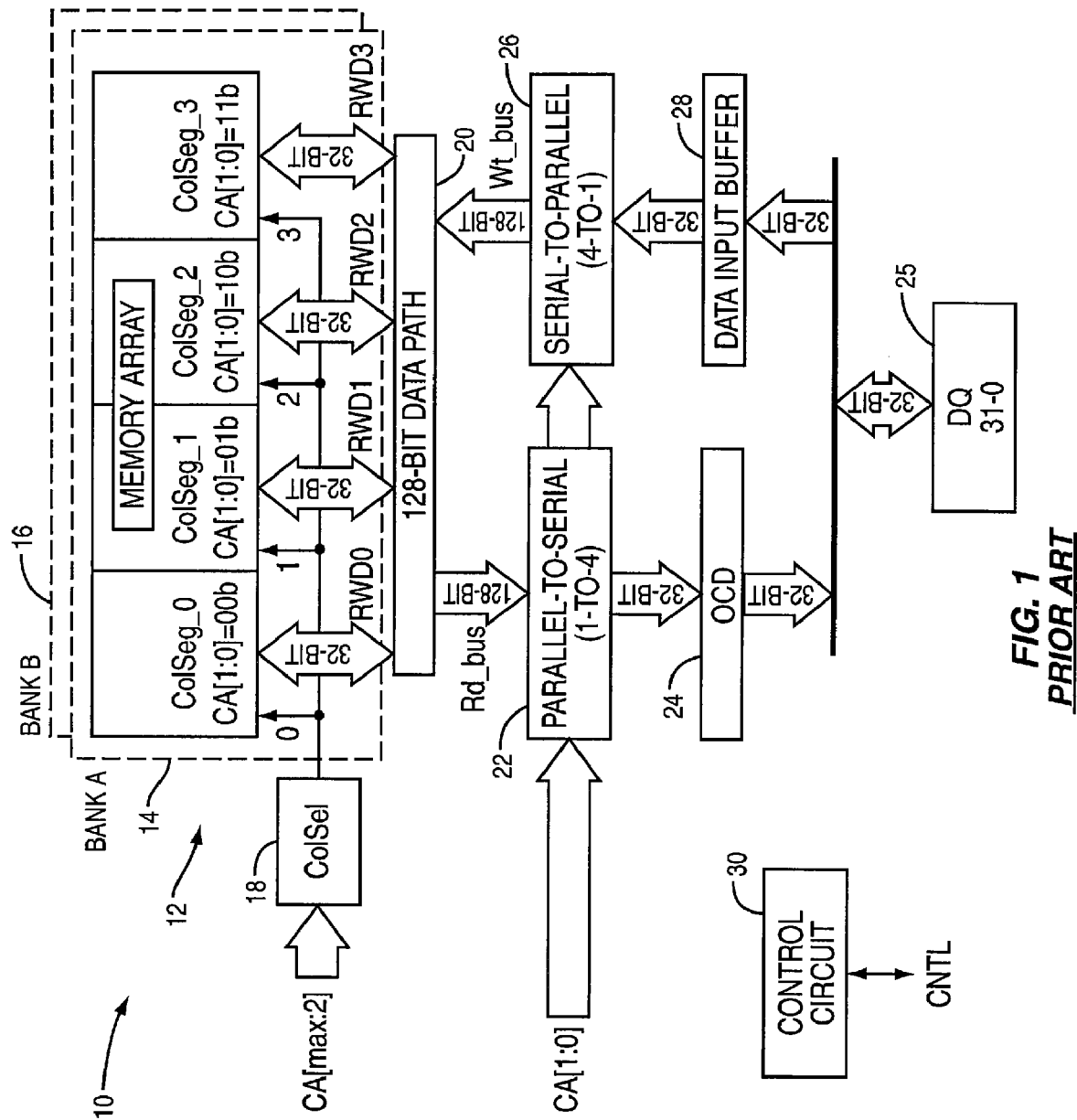
FIG. 1 is a functional block diagram of a conventional SDRAM component.

FIG. 1 depicts relevant functional elements of a SDRAM component 10. The SDRAM component 10 includes a DRAM array 12 organized as two or more banks 14, 16 (denoted A and B, respectively). Within each bank 14, 16, the DRAM array is logically (and may be physically) organized as a plurality of columns segments, each column segment of a width equal to that of the data bus (DQ) of the SDRAM component 10. For example, each bank 14, 16 of the SDRAM component 10 of FIG. 1 is organized as four 32-bit wide columns segments (ColSeg_0-ColSeg_3). The column segments are selected by a common output of a column segment decoder 18. The column segment decoder 18 decodes the column address, less the n least significant bits, where n=$\log_2$ (number of column segments).

Read and write data are transferred between the DRAM array 12 and a 128-bit data path 20 via four 32-bit Read/Write Data buses RWD0-RWD3. In response to a read request, the SDRAM component 10 prefetches 128 bits of data from ColSeg_0-ColSeg_3, via RWD0-RWD3, the 128-bit data path 20 and a 128-bit read bus. The data are serialized in a parallel-to-serial unit 22, with the first 32-bit word selected by the least significant n bits of the column address, i.e., CA[1:0] in the example of FIG. 1. Four 32-bit words are then successively transferred through on-chip drivers (OCD) 24 to the DQ pins 25.

Similarly, in response to a write request, the SDRAM component 10 captures (or prefetches) four successive 32-bit words of write data at the DQ pins 25 into a data input buffer 28. A serial-to-parallel unit 26 assembles the four words into a 128-bit data unit, with the order of the words determined by the least significant n bits of the column address. The data are then stored to ColSeg_0-ColSeg_3 of the DRAM array 12 via the 128-bit data path 20 and Read/Write Data buses RWD0-RWD3. By pipelining read or write burst data transfer operations, the SDRAM component 10 may effectively provide or accept data at four times the access speed of its DRAM array 12.

Read and write requests, also known as commands, encoded in control signals such as RAS, CAS, WE, and the like, are accepted by a control circuit 30, which in turn controls the operation of the SDRAM component 10. Although not shown in FIG. 1 for clarity, those of skill in the art will appreciate that the control circuit 30 may be connected to every functional block in the SDRAM component 10.

Figure 2:
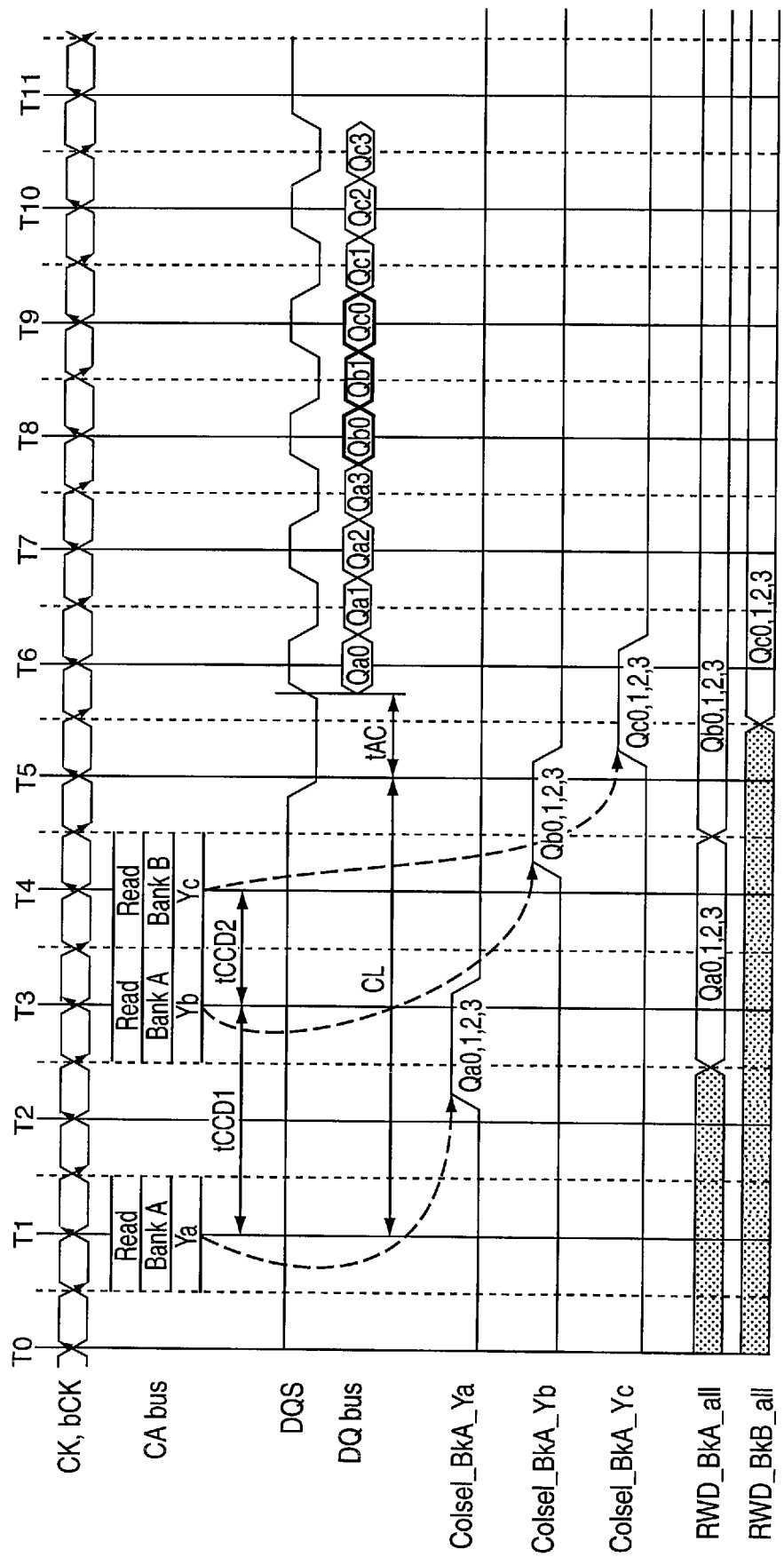
FIG. 2 is a timing diagram of a conventional interrupted burst data transfer.

FIG. 2 depicts a burst read request directed to bank A, followed by a second burst read request directed to the same bank, which is interrupted by a burst read request directed to a different bank. In the example depicted, the SDRAM component 10 is configured for a CAS latency of four, and tCCD1, the minimum time between column accesses (i.e., read-to-read or write-to-write burst requests) to the same bank, is twice the clock frequency. tCCD2, the minimum time between column accesses to a different bank, is normally the same. tCCD1=tCCD2=2*CLK is required (in DDR timing) to allow four burst data transfer cycles on the DQ bus. The first burst read request—directed to address Ya in bank A—is accepted at the beginning of clock cycle T1. 128 bits of data are prefetched from bank A in cycle T2, and the serialized data appear on the DQ bus beginning at T6. A Double Data Rate (DDR) SDRAM component 10 is depicted, providing a new word of "a" data on each of the four following clock transitions.

The second burst read request—directed to address Yb, also in bank A—is accepted at the beginning of clock cycle T3, a delay of tCCD1=2*CLK from the "a" read request. In response to this request, 128 bits of data are prefetched in cycle T4, and the serialized data begin to appear on the DQ bus beginning at T8.

The second burst read operation is interrupted by a read request directed to address Yc in bank B in the following cycle. Here, tCCD2 is only one clock cycle, since the access is to a different DRAM bank than the prior access, and since the prior burst operation is being terminated and does not require four full (DDR) data transfer cycles. A 128-bit prefetch is performed to bank B in cycle T5. Note that at the beginning of cycle T5, the SDRAM component 10 may be accessing both bank A and bank B simultaneously. That is, the column select signals for the bank B prefetch may be asserted prior to the column select signals for the bank A prefetch being fully de-asserted. This possible overlap may dramatically increase the instantaneous power consumption of the SDRAM component 10.

Two data words from the "b" request are provided on the DQ pins, at the beginning and midpoint of cycle T8. The "b" burst is then interrupted, and data from the "c" request is successively provided on the DQ bus during cycles T9-T10. Two data words (those from column segments 2 and 3 in this example) from the "b" request are discarded. In this manner, a conventional SDRAM component 10 may provide less than a full burst length of data, at the cost of excessive power consumption due to prefetch overlap (and the physically larger power net that worst-case design demands), and wasting the power required to prefetch and then discard two words of the interrupted burst transfer operation.

Figure 3:
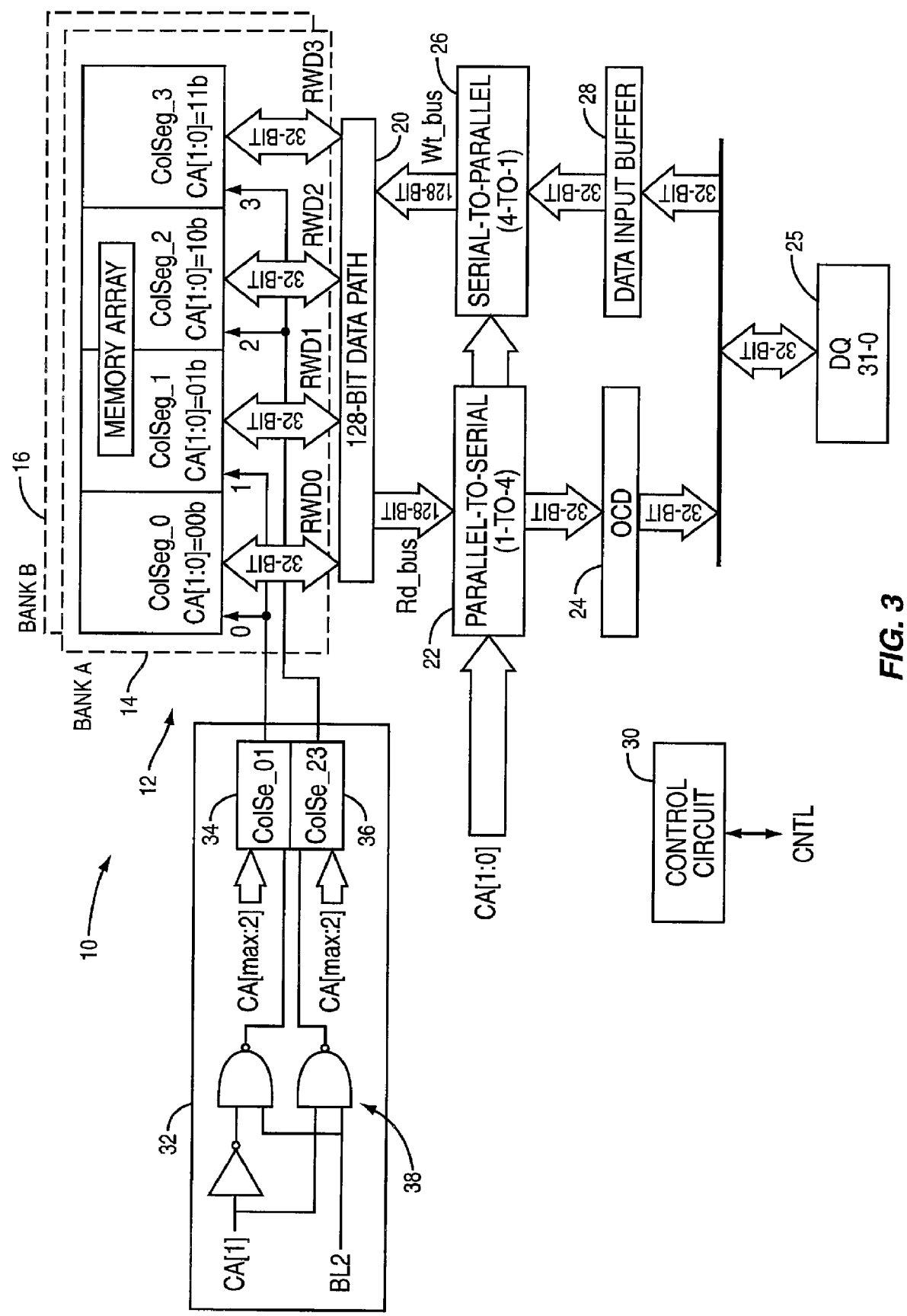
FIG. 3 is a functional block diagram of one embodiment of an integrated circuit.

According to one or more embodiments of the present invention, a burst data transfer operation of less than the normal prefetch data size is defined, in which only the desired data are prefetched, and no data is discarded. FIG. 3 depicts an SDRAM component 10 including one embodiment of an inventive column segment decoder 32 that is operative to select a subset of the column segments ColSeg_0-ColSeg_3, based on the least significant bits of the column address and an abbreviated burst indicator. In particular, the column segment decoder 32 includes two conventional column segment decoders 34, 36, each decoding the column addresses less the least significant n bits. Each column segment decoder 34, 36 additionally receives an enable signal from abbreviated burst decode logic 38. The abbreviated burst decode logic 38 generates enable signals to the column segment decoders 35, 36 based on some or all of the n least significant column address bits and an abbreviated burst indicator, denoted BL2 in FIG. 3, for "Burst Length 2."

The column segment decoder 32 asserts one of two separate column segment select signals—one for ColSeg_0 and ColSeg_1, and another for ColSeg_2 and ColSeg_3—if the abbreviated burst indicator BL2 is asserted. If BL2 is not asserted, all four column segments ColSeg_0—ColSeg_3 are selected, in response to the column address less the n least significant bits. BL2 is generated by the control circuit 30 of the SDRAM controller 10, in response to an abbreviated burst request. The abbreviated burst request is preferably a newly defined command, provided by a memory controller as a unique encoding of control signals. Alternatively, an abbreviated burst request may be indicated by providing a conventional burst data transfer command, and additionally asserting a new "abbreviated" signal. Other ways of indicating an abbreviated burst request may be readily devised by those of skill in the art. The only restriction is that the abbreviated burst request indication must be provided early in the data transfer cycle, at least in the read case, as the memory address decoding required for prefetching data proceeds immediately following receipt of a data read command.

The abbreviated burst request indicates that the memory controller requests an amount of data less than the SDRAM component's 10 nominal minimum burst length (which is defined by its nominal prefetch data size). In the exemplary embodiment of FIG. 3, an abbreviated burst request is a request to transfer two words of data, for an SDRAM component 10 having a nominal minimum burst length of four. In the abbreviated burst data transfer, only the indicated two words are prefetched, and no prefetched data are discarded.

Figure 4:
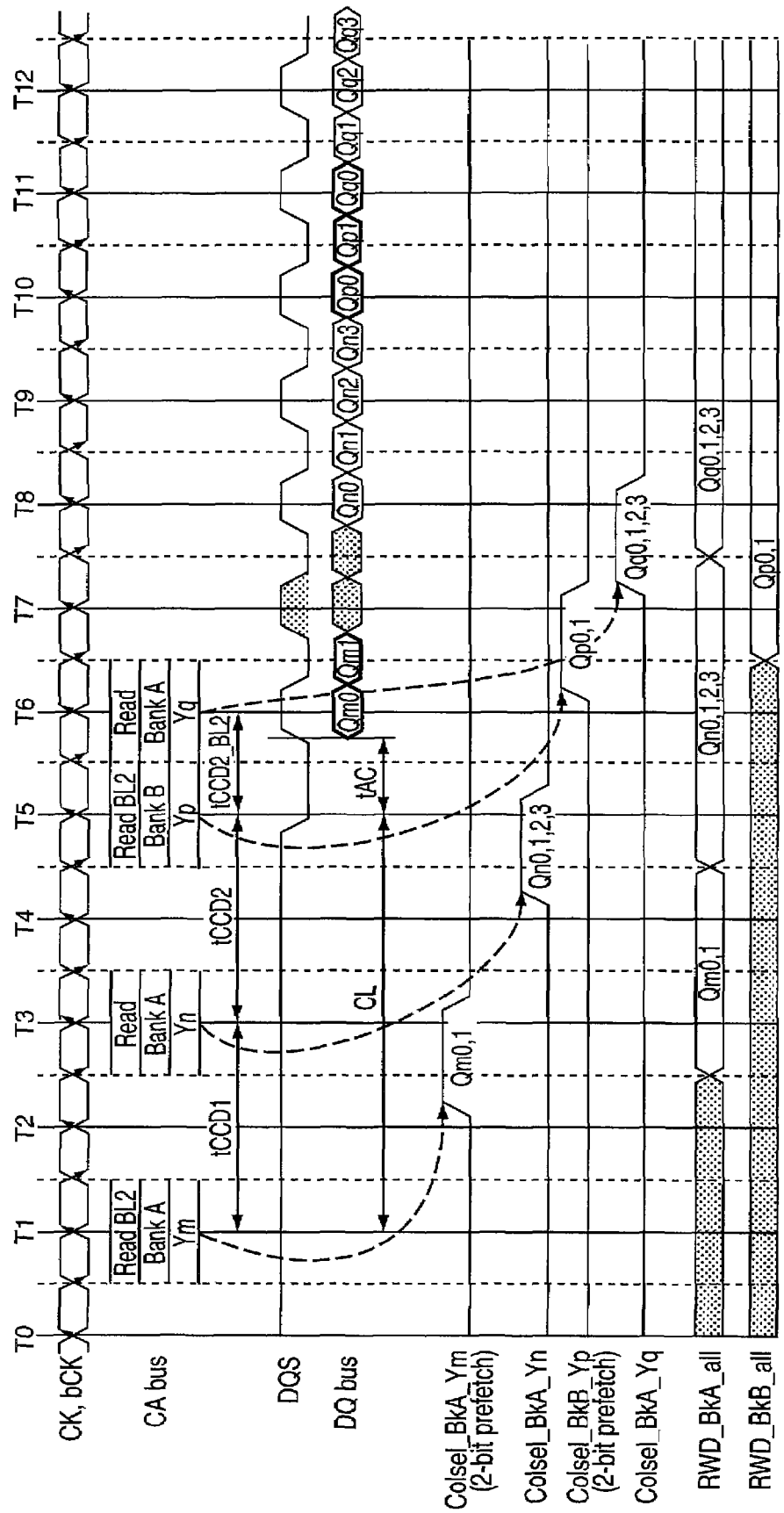
FIG. 4 is a timing diagram of one embodiment of an abbreviated burst data transfer.

FIG. 4 depicts an abbreviated burst read request directed to bank A of the SDRAM component 10 of FIG. 3, followed by a second burst read request directed to the same bank. FIG. 4 also depicts an abbreviated burst read request directed to bank B, followed immediately by a second burst read request directed to bank A. In latter sequence, the timing of data availability is the same as the interrupted burst read of FIG. 2, but the significant power loss associated with that technique is avoided.

An abbreviated burst read request directed to address Ym in bank A is accepted at the beginning of clock cycle T1. 64 bits of data are prefetched from only bank A ColSeg_0 and ColSeg_1 in cycle T2, and the serialized data appear on the DQ bus during T6. Following the abbreviated burst read command by tCCD1=2*CLK (a delay required by a successive access to the same bank), a conventional burst request directed to address Yn in bank A is accepted at the beginning of clock cycle T3. The requested four data words are provided on the DQ bus beginning in cycle T8. At tCCD2=2*CLK later (required to transfer four data words), an abbreviated burst read request directed to address Yp in bank B is accepted at T5. Two words are prefetched in cycle T6, and the serialized data are provided on the DQ bus in cycle T10.

Following the abbreviated burst request by tCCD2_BL2=1*CLK, a conventional read request directed to address Yq in bank B is accepted at T6. In this case, tCCD_BL2 is only one clock cycle, since the access is to a different bank than the preceding access, and also the abbreviated burst read requires only one clock cycle to provide both words on the data bus (with DDR timing). The full nominal prefetch data size of four words are prefetched in cycle T7, and provided on the DQ bus during cycles T11 and T12.

While the timing of the abbreviated burst request followed immediately by a conventional burst request is identical— from the perspective of a memory controller—to that of an interrupted burst, the abbreviated burst operation expends only half the power, in prefetching only half the data. Additionally, while there is a possibility of prefetch overlap early in cycle T7, the instantaneous power spike will be less than in the case of an interrupted burst, since only half of the column segments are being prefetched in cycle T6. This reduction in the maximum instantaneous power consumption allows the power net to be designed more aggressively, conserving integrated circuit real estate and reducing die size. However, the smaller power net means that the SDRAM component 10 can no longer support interrupted burst transfers, the instantaneous power consumption of which may exceed the power net's capability.

Although embodiments of the present invention have been described herein with respect to an exemplary embodiment with a memory array having four column segments, a 4-bit nominal prefetch data size, and a nominal minimum burst length of four, those of skill in the art will readily recognize that the present invention is not limited to this configuration, but rather may be advantageously applied to a broad array of memory configurations. For example, a memory component having a memory array configured as eight column segments, with an 8-bit nominal prefetch data size and a nominal minimum burst length of eight, may support abbreviated burst transfer operations of, e.g., BL2, BL4, and/or BL6. Indeed, individual selection of each column segment, and an abbreviated burst length of one, is within the scope of the present invention, regardless of the number of column segments and nominal prefetch data size.

Furthermore, although abbreviated burst data transfer operations have been described herein as a burst reads, the invention is fully applicable to burst write operations. In particular, with reference to FIG. 3, according to embodiment of the present invention, less than the nominal prefetch data size of write data may be successively accepted at the DQ pins 25 and stored in the input data buffer 28. Based on the least significant n bits of the column address and an abbreviated burst length indicator (e.g., BL2), the data may be stored to the memory array by activating less than all of the column segments ColSeg_0-ColSeg_3, with similar benefits of reduced power consumption. As used herein, the term "prefetching" refers to the collection of write data in the data input buffer 28 prior to storing the data in the DRAM array 12, as well as retrieving data from the DRAM array 12 prior to serializing and outputting the data on the DQ bus 25.

Still further, although embodiments of the present invention have been described herein with reference to SDRAM components, the invention is not limited to this type of memory. Rather, the inventive concept described and claimed here again may be advantageously applied to any component or circuit having a nominal prefetch data size in excess of its data transfer bus width—i.e., any circuit providing data to or from a memory array that must transfer the data in burst data transfer operations. Indeed, the invention is not limited to memory components, but may be implemented in ASICs, FPGAs, and the like, that prefetch data to or from a memory array wider than a data transfer bus, giving rise to a nominal minimum burst transfer length.

Although part of FIG. 4 describes the particular benefit of some embodiments of the present invention of emulating the functionality of an interrupted burst read from separate banks, the use of more than one memory bank is not necessary to derive benefit from the present invention. In particular, as described above, by prefetching only the required data from a memory array, the power expended in the prefetch operation is dramatically reduced, as compared to the prior art practice of prefetching a nominal prefetch data size and discarding some of the data.

As used herein, the nominal prefetch data size is the maximum amount of data that can be read from or written to the DRAM array 12 in one data transfer operation. As used herein, the nominal minimum burst length is the minimum burst length required to transfer the nominal prefetch data size across the integrated circuit's data bus. The nominal minimum burst length is thus normally the nominal prefetch data size divided by the width of the data bus. The nominal minimum burst length is normally the minimum burst length supported by an integrated circuit if a burst data transfer operation is not interrupted. As used herein, an abbreviated burst data transfer operation is a memory access that transfers less than the nominal prefetch data size to or from an integrated circuit without being interrupted by another data transfer operation.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of transferring data by an integrated circuit having a nominal minimum burst length defined by a nominal data prefetch size, comprising:
   accepting an abbreviated burst data read request directed to a first bank;
   prefetching less than the nominal data prefetch size and providing the data in an abbreviated burst data transfer less than the nominal minimum burst length.

2. The method of claim 1 further comprising accepting a burst data read request directed to a second bank, the burst data read request following the abbreviated burst data read request by a delay less than that required when following a burst data read request.

3. The method of claim 2 wherein the burst data read operation does not terminate the abbreviated burst data read operation.

4. The method of claim 1 wherein the integrated circuit is an SDRAM component.

5. The method of claim 1 further comprising:
   accepting an abbreviated burst data write request directed to a first bank; and
   accepting data in an abbreviated burst data transfer less than the nominal minimum burst length and storing less than the nominal data prefetch size to the first bank.

6. The method of claim 5 further comprising accepting a burst data write request directed to a second bank, the burst data write request following the abbreviated burst data write request by a delay less than that required when following a burst data write request.

7. A method of transferring data by an integrated circuit having a memory array logically configured as a plurality of column segments, comprising:
   accepting an abbreviated burst data transfer request;
   prefetching data from or to one or more but less than all of the column segments; and
   accepting or providing the data outside the integrated circuit in an abbreviated burst data transfer.

8. The method of claim 7 further comprising accepting a burst data transfer request following the abbreviated burst data transfer request by a delay less than that required when following a burst data transfer request.

9. The method of claim 8 wherein the burst data transfer operation does not interrupt the abbreviated burst data transfer operation.

10. An integrated circuit, comprising:
- a memory array logically partitioned into a plurality of column segments;
- a prefetch circuit operative to simultaneously transfer data to or from one or more but less than all column segments; and
- circuits operative to transfer the data to and from the integrated circuit in an abbreviated burst data transfer operation requiring fewer data transfer cycles than a nominal minimum burst transfer length for the integrated circuit.

11. The integrated circuit of claim 10 further comprising a control circuit operative to recognize an abbreviated burst data transfer request and to provide an indication of the abbreviated burst transfer to the prefetch circuit.

12. The integrated circuit of claim 11 wherein, in the absence of an abbreviated burst transfer indication, the prefetch circuit is operative to simultaneously transfer data to and from all column segments.

13. The integrated circuit of claim 11 wherein the memory array comprises two or more banks, and wherein the control circuit is operative to accept an abbreviated burst data transfer request directed to a first bank and to accept a subsequent burst data transfer request directed to a second bank after a delay less than that required if the subsequent burst data transfer request follows a burst data transfer request.

14. The integrated circuit of claim 13 wherein the burst data transfer operation does not interrupt the abbreviated burst data transfer operation.

15. An integrated circuit, comprising:
- a memory array logically partitioned into a plurality of column segments;
- means for simultaneously transferring data to or from one or more but less than all column segments; and
- means for transferring the data into or out of the memory component in an abbreviated burst data transfer operation.

16. The integrated circuit of claim 15 wherein means for simultaneously transferring data to or from one or more but less than all column segments comprises a data path the width of all column segments and a column address decoder receiving the column address and one or more abbreviated burst indicators and outputting independent select signals to subsets of the column segments.

17. The integrated circuit of claim 16 wherein the column address decoder selects all column segments if all abbreviated burst indicators are deasserted and selects one or more but less than all column segments if an abbreviated burst indicator is asserted.

18. The integrated circuit of claim 15 wherein the means for transferring the data into or out of the integrated circuit in an abbreviated burst data transfer operation comprises a control circuit operative to accept an abbreviated burst data transfer request from a controller.

19. The integrated circuit of claim 18 wherein the control circuit is further operative to accept a burst data transfer request subsequent to the abbreviated burst data transfer request and directed to a different bank, the burst data transfer request following the abbreviated burst data transfer request by a delay less than that required when following a burst data transfer request.

20. The integrated circuit of claim 18 wherein the control circuit disallows interruption of burst or abbreviated burst data transfers.

21. A method of transferring data in an integrated circuit having a nominal minimum burst length defined by a nominal data prefetch size, comprising:
- accepting an abbreviated burst data read request;
- prefetching data from a memory array; and
- providing all of the prefetched data in an abbreviated burst data transfer less than the nominal minimum burst length.

* * * * *